United States Patent
Sparling et al.

(10) Patent No.: US 9,809,120 B2
(45) Date of Patent: Nov. 7, 2017

(54) DISCRETE UNDER VOLTAGE/OVER VOLTAGE MONITORING CIRCUIT

(71) Applicant: Continental Automotive Systems, Inc., Auburn Hills, MI (US)

(72) Inventors: Larry A. Sparling, Buffalo Grove, IL (US); Russ Dalbke, Fox River Grove, IL (US); Amit Bahl, Algonquin, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 261 days.

(21) Appl. No.: 14/862,335

(22) Filed: Sep. 23, 2015

(65) Prior Publication Data

US 2017/0080807 A1    Mar. 23, 2017

(51) Int. Cl.
   B60L 11/18    (2006.01)
   G01R 19/165   (2006.01)
   G01R 19/25    (2006.01)

(52) U.S. Cl.
   CPC ........ B60L 11/18 (2013.01); G01R 19/16538 (2013.01); G01R 19/2513 (2013.01)

(58) Field of Classification Search
   CPC ................ B60L 11/18; G01R 19/2513; G01R 19/16538
   See application file for complete search history.

(56) References Cited

U.S. PATENT DOCUMENTS 5,691,870 A     11/1997  Gebara
6,454,033 B1 *   9/2002  Nathan ............... B60K 17/02
                                                    180/307
8,618,866 B2 *  12/2013  Fung .................... G11C 5/147
                                                    327/530
2002/0166073 A1 11/2002 Nguyen et al.
2005/0007711 A1 * 1/2005 Liu ..................... H02H 3/202
                                                    361/90
2008/0278133 A1 11/2008 Lee
2014/0218828 A1 * 8/2014 Lin ...................... H02H 7/09
                                                    361/33
2016/0311326 A1 * 10/2016 Steele .................. B60L 11/18

FOREIGN PATENT DOCUMENTS

EP          1227564          7/2002

OTHER PUBLICATIONS

Texas Instuments, "TPS65381-Q1 Multi-Rail Power Supply for Microcontrollers in Safety Applications", Jul. 2015, www.ti.com, [online], Available from: https://web.archive.org/web/20160413084831/http://www.ti.com/lit/ds/symlink/tps65381-q1.pdf [Accessed Apr. 13, 2016] See pp. 2-3, 90-100.

Search Report dated Apr. 13, 2016, from corresponding GB Patent Application No. GB1518771.9.

* cited by examiner

Primary Examiner — Jared Fureman
Assistant Examiner — Michael Warmflash

(57) ABSTRACT

Health status signals generated by components of a power supply system, including health status signals generated by a control processor, are logically combined together using discrete electronic components and which provide a single, highly-reliable enable/disable signal to a master switch. The master switch connects and disconnects the power supply to and from electrical loads.

6 Claims, 2 Drawing Sheets

DISCRETE UNDER VOLTAGE/OVER VOLTAGE MONITORING CIRCUIT

BACKGROUND

In the electronics art, it is well known that some semiconductors can be destroyed when voltages provided to them by a power supply go above or below a relatively narrow range of voltages. Microprocessors, microcontrollers and digital signal processors are especially vulnerable to power supply over voltages and under voltages and when such devices are used to control motor vehicles and industrial equipment, the real cost of a processor's failure due to an over voltage or an under voltage can be far more costly than the replacement cost of the processors themselves. In electronic systems, which can comprise many semiconductor devices and/or one or more processors, under voltages and over voltages can place an entire system in an indeterminate state.

It is also well known that many processors include their own power internal supply voltage monitoring circuitry. The prevailing practice has been to rely on such circuitry to determine whether a power supply voltage is too high or too low.

While prior art approaches for guarding against a power supply under voltage or over voltage might be adequate for most embedded systems, in applications where safety is paramount, such as in transportation control systems, the prior art approach to monitoring power supply voltages using processor-internal circuits can be inadequate. An apparatus and method for monitoring a power supply voltage and, detecting under voltage as well as over voltage would be an improvement over the prior art.

DETAILED DESCRIPTION

As used herein, an "undervoltage" is considered to be any reduction or decrease in the voltage output from a power supply that provides power to an electrical load, including microelectronic devices, the time duration of the reduction or decrease being long enough to cause excessive current to be drawn by a load and which if continued will damage the load.

An "overvoltage" is considered to be any increase or surge in the voltage output from a power supply and that exceeds or is above an upper limit of a load device. Depending on its duration, an overvoltage can be transient, long term or permanent.

The term, "discrete" refers to an elemental electronic circuit relative to a larger system or device. By way of example, logic gates can be construed from discrete transistors, diodes and resistors. Flip-flop circuits, latches, counters and the like can be constructed from discrete logic gates. A processor can be constructed from discrete flip-flops, latches and counters.

Figure 1:
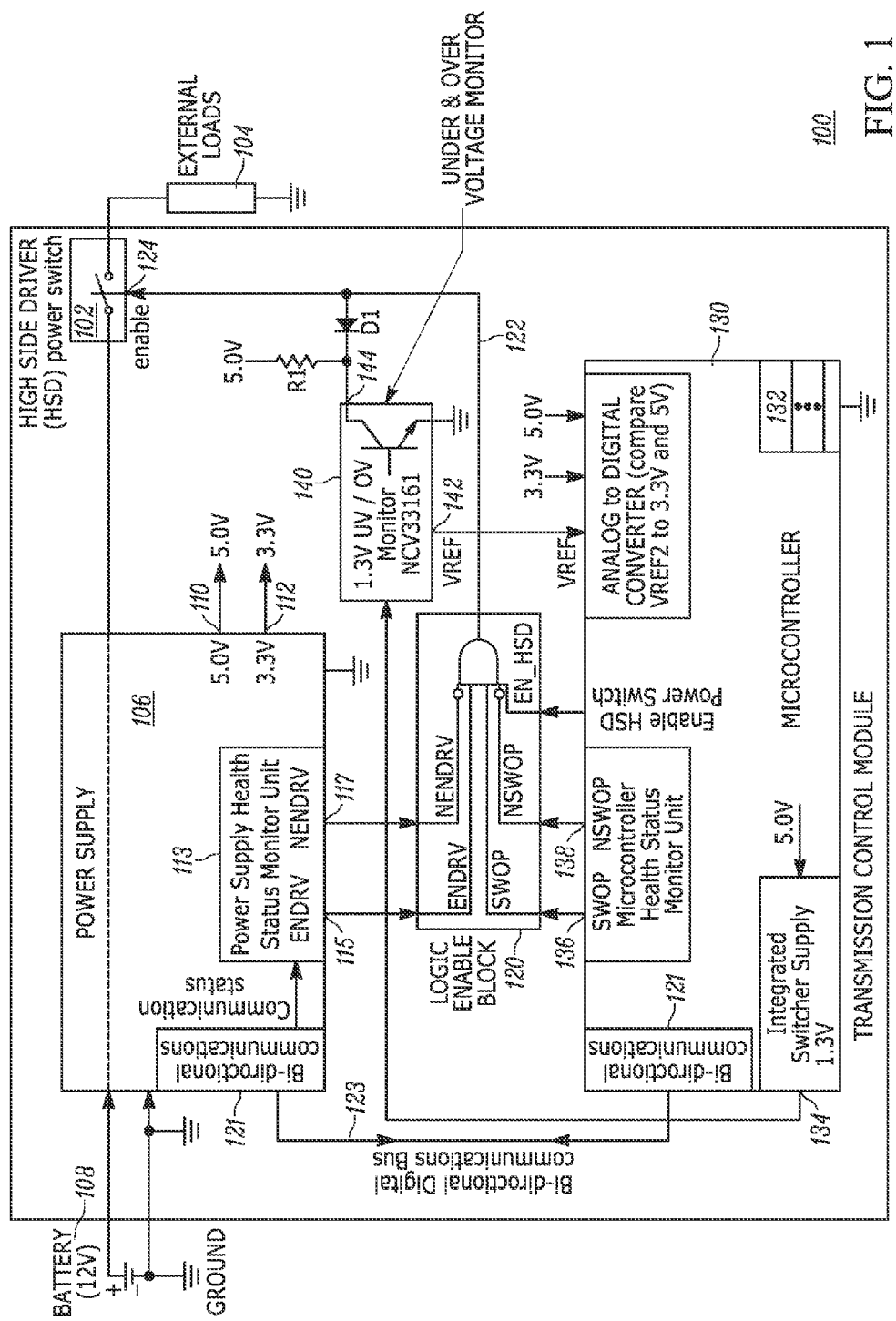
FIG. 1 depicts a preferred embodiment of a system for controlling electric energy provided to an electrical load in a vehicle using discrete devices.

FIG. 1 depicts a system 100 for controlling electric energy that is provided to an electrical load 104 in a vehicle, not shown, and which monitors the status or condition of multiple different power supply voltages for both under voltage and over voltage conditions. The system 100 uses one or more discrete devices, namely a discrete logic gate 120 and a discrete transistor 140, to control whether electrical energy is provided to a load 104. When an undervoltage or overvoltage is detected by any one or more of the devices comprising the system 100, the discrete devices cause the power supply 106 to be disconnected from the load 104.

The system 100 comprises an electrically operable driver switch or relay 102. The relay 102 is constructed (configured) to connect an electrical load 104 to the battery 108 via the power supply 106 responsive to an enable signal 124 provided to the switch 102 by the concurrence of two discrete devices, i.e., the output of an under voltage and over voltage monitor 140 and the output of a multi-input AND gate 120. The power supply 106 also generates from the battery 108 at least two, direct current (D.C.) voltages 110 and 112 as output signals.

As used herein, the term bus refers to a set of electrically-parallel conductors in a computer system and that forms a main transmission path for the system. In FIG. 1, the power supply 106 and the computer/processor 130 are each provided with conventional bi-directional bus interface circuitry 121. The power supply 106 is thereby communicatively coupled to the computer/processor 130 through a bi-directional bus 123 that extends between the interface circuitry 121.

The power supply 106 is constructed with its own, internal health status monitoring circuitry 113, not germane to the invention described and claimed hereinafter. The health status circuitry 113 or the processor 130 or both of them monitor the ability of the power supply 106 and the computer/processor 130 to communicate with each other via the bus 123.

The health status circuitry 113 preferably, but not necessarily, provides two digital output signals, which are complements of each other, i.e., "complementary." The binary values of the two digital output signals indicate at least whether the power supply output voltages 110 and/or 112 are above predetermined low limits and below predetermined high limits for the power supply 106 and also that the power supply 106 is operating properly and able to communicate with the microcontroller via a bi-directional digital communications bus. Alternate embodiments of the power supply provide a single health status indicator. The actual values of the low and high voltage limits are not germane to the invention described and claimed hereinafter.

To be clear, one of the health status signals of the power supply 106 is denominated as the ENABLE DRIVER or "ENDRB" output 115. Its complementary signal is the NOT-ENABLED DRIVER, or "NENDRB" 117. In addition to indicating the output voltages as being within or outside of low and high limits, the health status signals 115, 117 can also indicate whether the power supply 106 and computer/processor 130 are able to communicate with each other via the bus 123.

Both of the health status signals 115, 117 are provided to corresponding inputs of a discrete logic device 120, preferably a discrete multi-input AND gate. Examples of such a gate include but are not limited to 7430 and 7440 AND gates.

The output 122 of the AND gate is connected to the output 144 of a voltage monitor 140, embodied as a discrete NPN bi-polar junction (BJT) transistor. The collector of the transistor is coupled to the five volts signal 114 output from the power supply 106, through a current-limiting/pull-up resistor 146. The collector is also connected, however, to the anode of a discrete, steering silicon diode 148. Those of ordinary skill in the electronic art should thus recognize that the enable input 124 of the switch 102 will be active when the output 122 of the AND gate 120 is active or true and when the discrete transistor comprising the voltage monitor 140 is inactive.

In addition to the power supply 106, logic circuit 120 and voltage monitor 140, the system 100 comprises a computer 130 and an associated, non-transistory memory device 132, e.g., static or dynamic RAM or a ROM, which stores executable program instructions for the computer 130. In a preferred embodiment, the computer 130 is embodied as a microcontroller having the memory 132 co-located on the same semi-conductor die.

As shown in FIG. 1, the first and second supply voltages 110, 112 generated by the power supply 106 are provided to the computer 130 as input voltages, which the computer 130 requires to operate. Program instructions stored in the memory device 132, when executed, cause the computer 130 to generate from one or both of the first and second power supply voltages 110, 112, a third power supply voltage 134. Other program instructions cause the processor 130 to generate its own, complementary microcontroller status signals 136 and 138, the states of which indicate whether the computer 130 is operating properly.

The computer status signals 136 and 138 are generated internally by circuitry inside the computer 130 and are not germane to the invention described and claimed hereinafter. The computer status signals 136, 136, however, are also provided to corresponding inputs of the logic circuit 120.

As shown in FIG. 1, the power supply health status signals 115, 117 and the computer's health status signals 136, 138 are provided to the AND gate 120 and are thus considered to be merged or combined and checked by a discrete electronic device 120, typically more rugged and more reliable than the same type device implemented in or as part of a large scale integrated (LSI) circuit.

As shown in the figure, the third supply voltage 134 generated by the computer 130 is provided to the voltage monitoring circuit 140, which also outputs a voltage reference signal 142 to the computer 130. In a preferred embodiment, the second reference signal 142 is considered to be an independent reference voltage, which is provided to the computer 130 and used by the computer 130 to determine whether the two input voltages 110 and 112 from the power supply 106 are correct. The computer health status signals 136, 138 are thus active or true when all three supply voltages 110, 112 and 134 are correct.

The output of the logic circuit 120, and the enablement of the switch 102, is thus dependent upon multiple health status indicator signals 115, 117, 136, 138 and 144, all being correct. Stated another way, the enablement of the switch 102 is dependent upon several health status monitor signals being correct.

In a preferred embodiment, the system 100 is part of an automotive transmission control module, not shown but well known to those of ordinary skill in the automotive electronics art. The system 100 controls whether electrical power is provided to an electrical load 104 in a vehicle transmission, typically embodied as one or more electromechanical transmission clutch solenoids, which determine whether a particular gear or gears are employed. The system 100 thus provides a highly-reliable over-voltage/under voltage protection device for monitoring multiple different voltages and controlling whether power is provided to a transmission including its clutches, providing an enhanced safety mechanism over the prior art.

Figure 2:
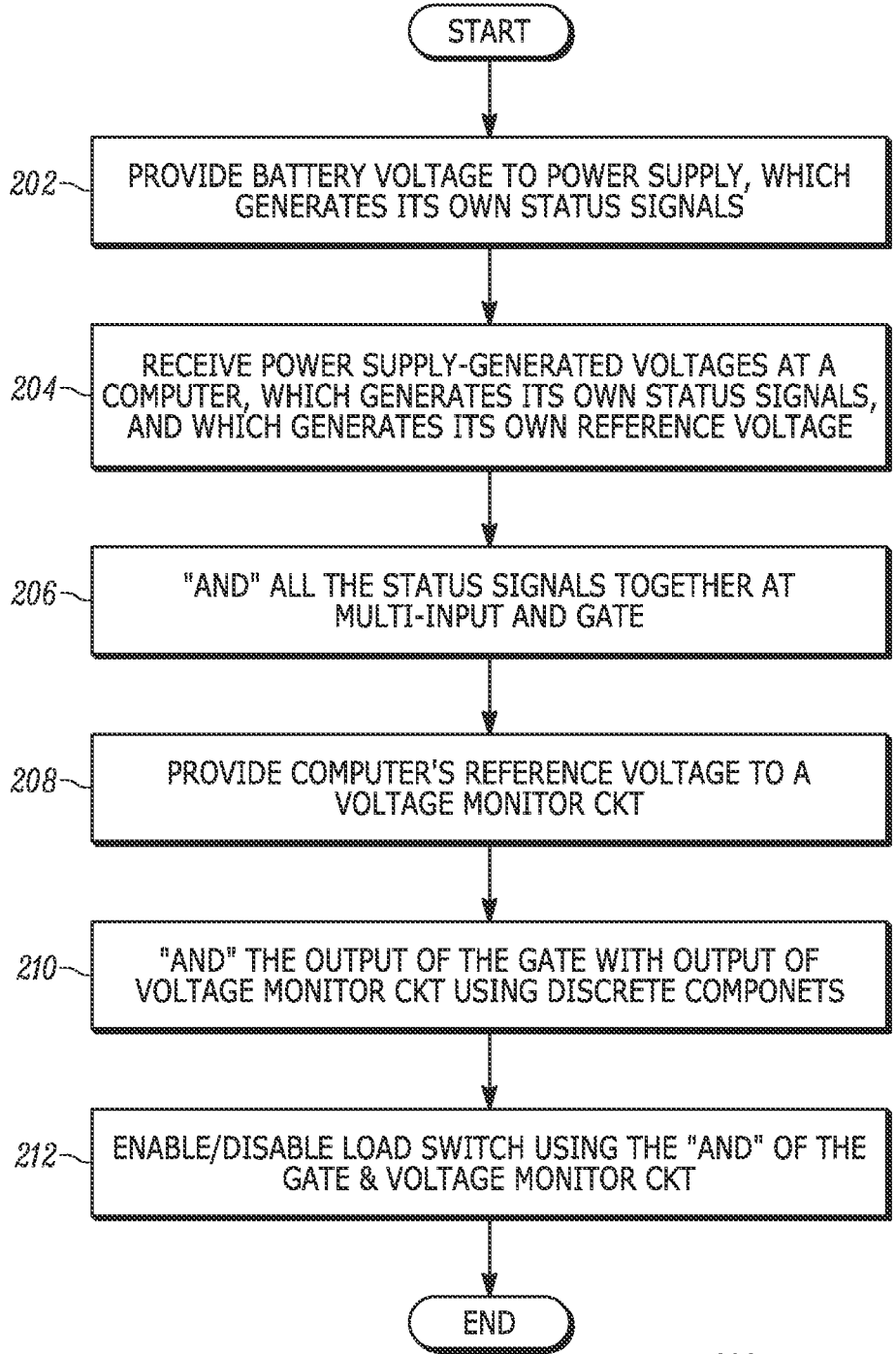
FIG. 2 depicts a method controlling electric energy provided to an electrical load in a vehicle using discrete devices.

Those of ordinary skill in the art should appreciate that the circuit described above and shown in FIG. 1 enables a method of reliably monitoring several different voltages and controlling whether power is provided to a load, such as one or more electrically-operated solenoids of a vehicle transmission. Such a method 200, which is depicted in FIG. 2, includes at step 202 providing a battery voltage to a power supply 106 which generates its own status signals and outputs its own internally-generated supply voltages for other circuitry of the transmission control module.

At step 204, the power supply-generated voltages 110, 114 are provided to a computer or processor 130, a function of which is to control the transmission control module but which also generates its own internal reference voltage 134. The computer 130 generates its own status signals 136, 138, which indicate the "health" of the computer 134 and are provided to inputs of an AND gate 120 with the power supply status signals 115, 117 generated at step 202. As described above, such a gate is preferably embodied as a discrete multi-input AND gate. Such devices are well known to those of ordinary skill in the electronics art to be far more reliable than the devices commonly found in high integration density microcomputers, microcontrollers, digital signal processors and application specific integrated circuits (ASICs).

At step 208, the reference voltage generated by the computer is provided to a separate monitor circuit 140, which compares the magnitude of the computer's reference voltage to a reference and determines whether the reference voltage is itself accurate.

At step 210, the output of the multi-input "AND" gate is "ANDed" with the output of the voltage monitor, preferably using a discrete steering diode, which at step 212 enables or disables an electrically-operated switch which connects the power supply to a load.

By using discrete components, which are known to be more robust and therefore more reliable than complex processors, multiple different supply voltages required to safely operate an industrial load, such as a clutch in an automobile transmission, can be safely monitored together to control whether they are under or over predetermined voltage limits.

The foregoing description is for purposes of illustration only. The true scope of the invention is set forth in the following claims.

What is claimed is:

1. A system for controlling electric energy provided to an electrical load in a vehicle, the system comprising:
   an electrically operable driver switch, configured to connect the load to a power supply;
   a power supply coupled to the electrically operable driver switch, the power supply being configured to:
   receive electric energy from a vehicle battery;
   provide current to the electrical load through the electrically operable driver switch;
   generate first and second supply voltages from the vehicle battery and provide the first and second supply voltages as outputs of the power supply;
   provide first and second complementary power supply status output signals, states of the first and second complementary power supply status output signals indicating at least whether the battery voltage is between a low voltage limit and a high voltage limit;
   a computer, operatively coupled to the power supply to receive the first and second supply voltages, the computer being configured to generate and output a third supply voltage, and provide first and second complementary microcontroller status signals, states of the first and second complementary microcontroller status signals indicating at least whether the microcontroller is operating properly;

a logic circuit coupled to the power supply, the computer and to the electrically operable driver switch, the logic circuit having a first output, which provides a first control signal to the electrically operable driver switch responsive to states of the first and second complementary microcontroller status signals and responsive to states of the first and second complementary power supply status output signals; and a voltage monitor coupled to the computer, the voltage monitor receiving the third supply voltage from the computer and providing a reference to the computer, the voltage monitor also being coupled to the electrically operable driver switch and providing a second control signal to the electrically operable switch;

wherein the electrically operable driver switch closes and provides battery power to the load responsive to both the first and second control signals.

2. The system of claim 1, wherein the third supply voltage is an independent reference voltage provided by the computer and wherein the computer is configured to compare at least one of the first and second supply voltages from the power supply, to the independent reference voltage.

3. The system of claim 1, wherein the logic circuit comprises one or more logic gates and provides an "AND" of the first and second complementary microcontroller status signals and of the first and second complementary power supply status signals, the logic circuit first output being combined with the second control signal of the voltage monitor to activate the electrically operable drive switch.

4. The system of claim 3, wherein the voltage monitor consists essentially of a transistor.

5. The system of claim 1, further comprising an electrical load coupled to the electrically operable driver switch, the electrical load comprising a solenoid for a transmission clutch.

6. A method of monitoring a plurality of direct current (D.C.) voltages of a vehicle transmission control module and controlling whether power is provided to an electrical load by the vehicle transmission control module, the method comprising:

a) provide a battery voltage to a power supply, which is configured to:

1) provide current to the electrical load through an electrically operable switch;

2) generate first and second supply voltages from the battery and provide the first and second supply voltages as outputs of the power supply;

3) generate first and second complementary power supply status output signals, states of the first and second complementary power supply status output signals indicating at least 1) whether the power supply voltages are between a low voltage limit and a high voltage limit, 2) if bi-directional communications between the power supply and a control processor for the power supply are possible; and 3) provide the first and second complementary power supply status output signals to a logic circuit;

b) receive at a computer coupled to the power supply, the first and second supply voltages from the power supply and generate by the computer, a third supply voltage, the computer being configured to provide first and second complementary microcontroller status signals having only first and second states, at least one of the states indicating at least whether the microcontroller is operating properly;

c) receive at a logic circuit, the first and second complementary microcontroller status signals and the first and second complementary power supply status output signals;

d) generate by the logic circuit, a first output signal indicating that the power supply and the computer are operating properly, the output signal being generated responsive to receipt of the first and second complementary power supply status output signals and the first and second complementary microcontroller status signals;

e) generate by a voltage monitor signal, a second output signal indicating that the third power supply voltage is correct;

f) logically ANDing the first and second output signals.

* * * * *